(12) United States Patent
Jacob et al.

(10) Patent No.: US 10,056,331 B2
(45) Date of Patent: Aug. 21, 2018

(54) PROGRAMMABLE VIA DEVICES WITH METAL/SEMICONDUCTOR VIA LINKS AND FABRICATION METHODS THEREOF

(71) Applicant: GLOBALFOUNDRIES Inc., Grand Cayman (KY)

(72) Inventors: Ajey P. Jacob, Watervliet, NY (US); Suraj K. Patil, Ballston Lake, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/724,563

(22) Filed: Oct. 4, 2017

(65) Prior Publication Data

US 2018/0033726 A1 Feb. 1, 2018

Related U.S. Application Data

(62) Division of application No. 14/867,341, filed on Sep. 28, 2015, now Pat. No. 9,812,393.

(51) Int. Cl.
*H01L 23/52* (2006.01)
*H01L 23/525* (2006.01)
*H01L 23/522* (2006.01)

(52) U.S. Cl.
CPC ...... *H01L 23/5256* (2013.01); *H01L 23/5226* (2013.01)

(58) Field of Classification Search
CPC .......... H01L 23/5256; H01L 23/5226
See application file for complete search history.

(56) References Cited

U.S. PATENT DOCUMENTS

| 6,933,591 B1* | 8/2005 | Sidhu | H01L 23/5256 |
| | | | 257/209 |
| 8,816,327 B2 | 8/2014 | Chang et al. | |
| 2002/0018355 A1* | 2/2002 | Johnson | G11C 11/5692 |
| | | | 365/103 |

OTHER PUBLICATIONS

"Electrically Programmable Fuse (eFUSE) Using Electromigration in Silicides", IEEE EDL, vol. 23 No. 9, pp. 523-525, 2002, C. Kothandaraman, et al.
"A Novel Via-fuse Technology Featuring Highly Stable Blow Operation with Large On-off Ratio for 32nm Node and Beyond", IEEE, pp. 43, 2007, H. Takaoka, et al.
"eFuse Design and Reliability", IEEE International Integrated Reliability Workshop, 2008, W.R. Tonti.

* cited by examiner

*Primary Examiner* — Matthew Gordon
(74) *Attorney, Agent, or Firm* — Heslin Rothenberg Farley & Mesiti P.C.

(57) ABSTRACT

Programmable via devices and fabrication methods thereof are presented. The programmable via devices include, for instance, a first metal layer and a second metal layer electrically connected by a via link. The via link includes a semiconductor portion and a metal portion, where the via link facilitates programming of the programmable via device by applying a programming current through the via link to migrate materials between the semiconductor portion and the metal portion to facilitate a change of an electrical resistance of the via link. In one embodiment, the programming current facilitates formation of at least one gap region within the via link, the at least one gap region facilitating the change of the electrical resistance of the via link.

17 Claims, 5 Drawing Sheets

PROGRAMMABLE VIA DEVICES WITH METAL/SEMICONDUCTOR VIA LINKS AND FABRICATION METHODS THEREOF

CROSS-REFERENCE TO RELATED APPLICATION

This application is a divisional of U.S. application Ser. No. 14/867,341 filed Sep. 28, 2015, which is hereby incorporated herein by reference in its entirety.

TECHNICAL FIELD

The present invention relates to devices, such as semiconductor devices, and more particularly to programmable devices, such as programmable via devices having via links which include metal and semiconductor portions.

BACKGROUND OF THE INVENTION

In the fabrication of integrated circuits, one-time programmable (OTP) memories may be used to facilitate programming of certain information on-chip during fabrication processing or subsequently thereafter. So-called e-fuses have been proposed, in which a fuse link is "blown" or open-circuited to achieve programming. For example, a fuse link may be open-circuited by catastrophic electromigration or thermal rupture/melting. In such a case, a single bit may be stored because, for example, an open-circuit may be sensed and interpreted as a digital 0 and a closed-circuit may be sensed and interpreted as a digital 1. Conventional electromigration or thermal rupture based fuse techniques, however, have several drawbacks that limit their usefulness.

For instance, conventional fuse devices require high voltages for fast programming at higher currents, and are therefore not suitable as semiconductor devices continued to be scaled down in size and voltage in advanced technology nodes, because the required high programming voltages and current may damage such on-chip semiconductor devices. In addition, existing devices are only useful for programming digital information, because an e-fuse is either blown or not, and the catastrophic failure of a fuse link cannot be controlled to allow for partial open-circuiting to facilitate the storage of continuous, non-binary information (e.g. analog information).

Therefore, a need exists for new programmable devices, such as one-time programmable devices, for analog or digital use, to overcome the limitations of electromigration or thermal rupture based e-fuses.

BRIEF SUMMARY

The shortcomings of the prior art are overcome, and additional advantages are provided, through the provision, in one aspect, of a programmable via device. The programmable via device includes: a first metal layer and a second metal layer electrically connected by a via link. The via link includes a semiconductor portion and a metal portion, where the via link facilitates programming of the programmable via device by applying a programming current through the via link to migrate materials between the semiconductor portion and the metal portion to facilitate a change of an electrical resistance of the via link.

In another aspect, a method of fabricating a programmable via device is presented. The method includes forming a first metal layer and a second metal layer above a substrate. The method further includes providing a via link electrically connecting the first metal layer and the second metal layer, the via link including a semiconductor portion and a metal portion. The via link facilitates programming of the programmable via device by applying a programming current through the via link to migrate materials between the semiconductor portion and the metal portion to facilitate a change of an electrical resistance of the via link.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, programmable via devices and methods for fabricating programmable via devices, for example, for use as one-time programmable memories for integrated circuits or chips. In the fabrication of integrated circuits, one-time programmable memories may be used to facilitate programming of certain information on-chip during fabrication processing or subsequently thereafter. So-called e-fuses have been proposed, in which a fuse link is "blown" or open-circuited by catastrophic electromigration or thermal rupture of a fuse link to achieve programming. In such a case, a single bit may be stored because, for example, an open-circuit may be sensed and interpreted as a digital 0 and a closed-circuit may be sensed and interpreted as a digital 1. Existing electromigration or thermal rupture-based fuse based techniques, however, have several drawbacks that limit their usefulness.

For instance, existing fuse devices require high voltages (and current) for programming, and are therefore not suitable as semiconductor devices continued to be scaled down in size in advanced technology nodes, because the required high programming voltages (or current) may damage such on-chip semiconductor devices. In addition, existing devices are only useful for programming digital information, because an e-fuse is either blown or not, and the catastrophic failure of a fuse link cannot be controlled to allow for partial open-circuiting to facilitate the storage of continuous, non-binary information. Therefore, a need exists for new programmable devices to overcome the limitations of electromigration or thermal rupture based e-fuses, such as programmable devices using, e.g., non-catastrophic migration of materials, to allow for controlled programming.

Generally stated, provided herein, in one aspect, is a programmable via device. The programmable via device includes: a first metal layer and a second metal layer electrically connected by a via link. The via link includes a semiconductor portion and a metal portion, where the via link facilitates programming of the programmable via device by applying a programming current through the via link to migrate materials between the semiconductor portion and the metal portion to facilitate a change of an electrical resistance of the via link.

In one embodiment, the programming current facilitates formation of at least one gap region within the via link, the at least one gap region facilitating the change of the electrical resistance of the via link. In another embodiment, the metal portion of the via link contacts the first metal layer and separates the semiconductor portion of the via link from the first metal layer. In a further embodiment, the via link includes another metal portion, the metal portion contacts the first metal layer, the other metal portion contacts the second metal layer, and the semiconductor portion of the via link separates the metal portion and the other metal portion of thereof.

In one example, the via link includes another semiconductor portion, the semiconductor portion contacts the first metal layer, the other semiconductor portion contacts the second metal layer, and the metal portion of the via link separates the semiconductor portion and the other semiconductor portion thereof. In another example, the programming current is configured to heat the via link to facilitate the migrating of the materials of the via link. In a further example, the programming current facilitates a reaction of the metal portion and the semiconductor portion of the via link to form a semiconductor-metal alloy.

In one embodiment, the programming current facilitates increasing an electrical resistance of the via link of the programmable via device. In another embodiment, the programming current facilitates open-circuiting the programmable via device. In a further embodiment, the via link has a certain thickness, the certain thickness of the via link being selected to facilitate programming of the programmable via device with the programming current.

Reference is made below to the drawings, which are not drawn to scale for ease of understanding, wherein the same reference numbers used throughout different figures designate the same or similar components.

Figure 1:
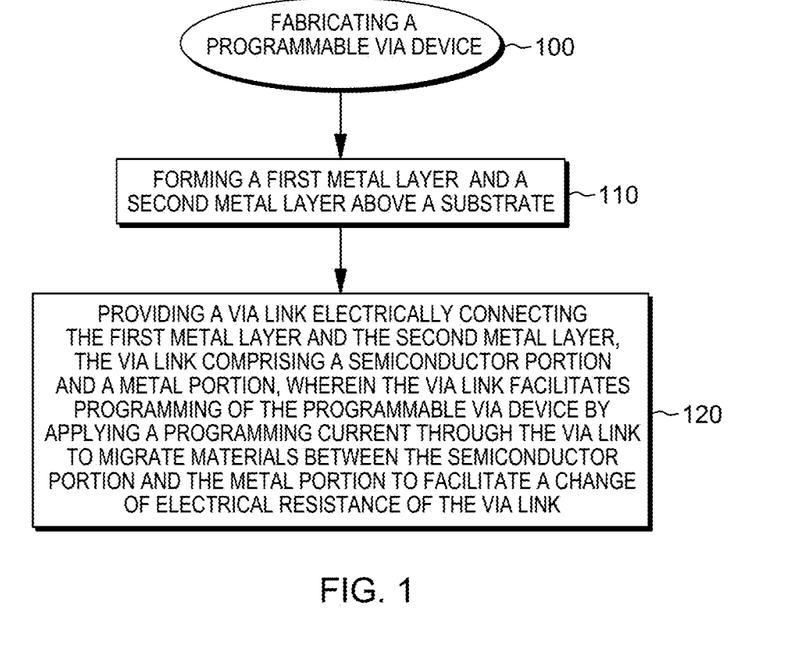
FIG. 1 depicts embodiments of a process for fabricating programmable via devices, in accordance with one or more aspects of the present invention.

FIG. 1 depicts embodiments of a process for fabricating programmable via devices 100, in accordance with one or more aspects of the present invention. For instance, the method includes forming a first metal layer and a second metal layer above a substrate 110. The method further includes providing a via link electrically connecting the first metal layer and the second metal layer, the via link including a semiconductor portion and a metal portion, where the via link facilitates programming of the programmable via device by applying a programming current through the via link to migrate materials between the semiconductor portion and the metal portion to facilitate a change of an electrical resistance of the via link 120.

In one implementation of the method, the programming current facilitates formation of at least one gap region within the via link, the at least one gap region facilitating the change of the electrical resistance of the via link. In another implementation, the metal portion of the via link contacts the first metal layer and separates the semiconductor portion of the via link from the first metal layer. In a further implementation, the via link includes another metal portion, the metal portion contacts the first metal layer, the other metal portion contacts the second metal layer, and the semiconductor portion of the via link separates the metal portion and the other metal portion of thereof.

In one embodiment of the method, the via link includes another semiconductor portion, the semiconductor portion contacts the first metal layer, the other semiconductor portion contacts the second metal layer, and the metal portion of the via link separates the semiconductor portion and the other semiconductor portion thereof. In another embodiment, the programming current is configured to heat the via link to facilitate the migrating of the materials of the via link. In a further embodiment, the programming current facilitates a reaction of the metal portion and the semiconductor portion of the via link to form a semiconductor-metal alloy.

In one example of the method, the programming current facilitates increasing an electrical resistance of the via link of the programmable via device. In another example, the programming current facilitates open-circuiting the programmable via device. In a further example, the via link has a certain thickness, the certain thickness of the via link being selected to facilitate programming of the programmable via device with the programming current.

Figure 2A:
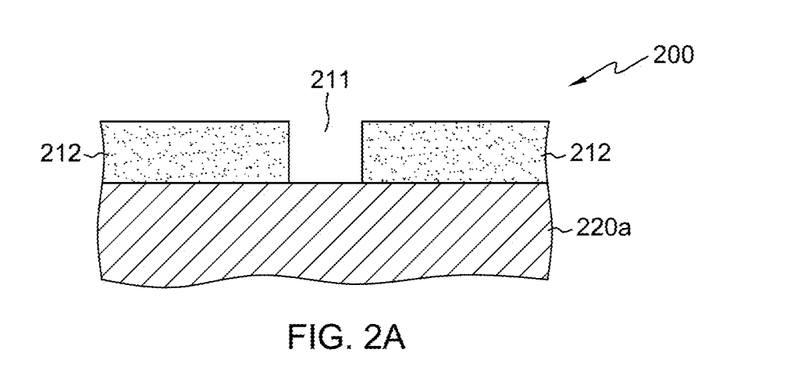
FIG. 2A is a cross-sectional elevational view of a structure found in a programmable via device fabrication process, in accordance with one or more aspects of the present invention.
Figure 2B:
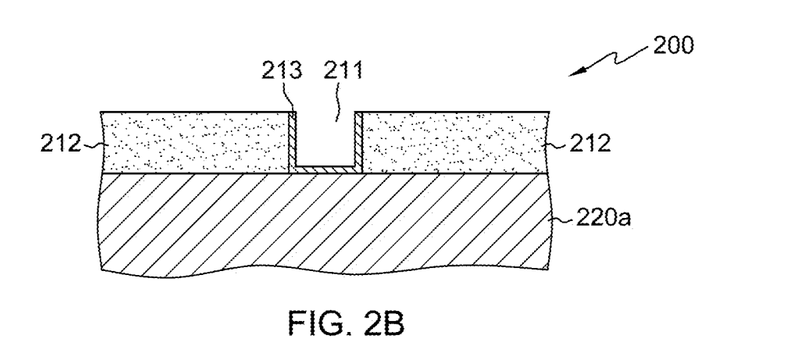
FIG. 2B depicts the structure of FIG. 2A, after providing a metal portion of a via link above a first metal layer, in accordance with one or more aspects of the present invention.
Figure 2C:
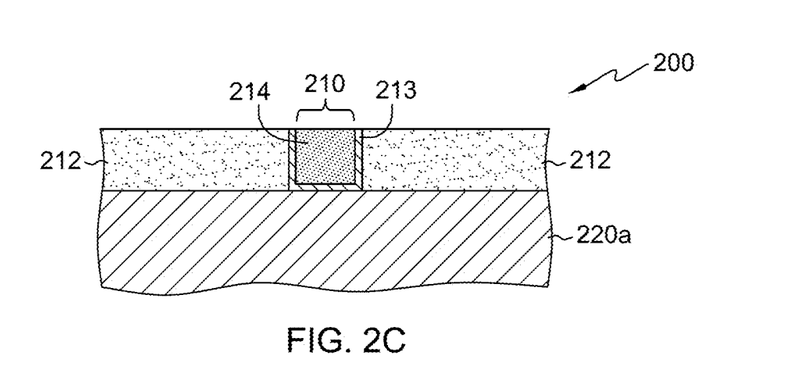
FIG. 2C depicts the structure of FIG. 2B, after providing a semiconductor portion of the via link, in accordance with one or more aspects of the present invention.
Figure 2D:
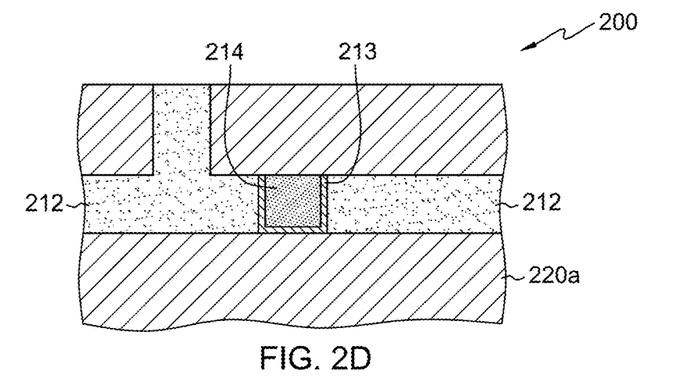
FIG. 2D depicts the structure of FIG. 2C, after providing a second metal layer, where the via link electrically connects the first metal layer and the second metal layer, in accordance with one or more aspects of the present invention.
Figure 2E:
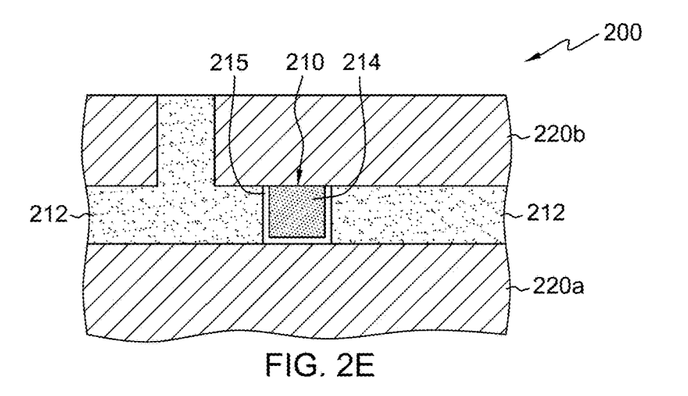
FIG. 2E depicts the structure of FIG. 2D, after programming the programmable via device, in accordance with one or more aspects of the present invention.

By way of summary, FIGS. 2A-2D describe one or more embodiments of a process for fabricating a programmable via device, and FIG. 2E describes one or more embodiments of programming a programmable via device, in accordance with one or more aspects of the present invention.

FIG. 2A is a cross-sectional elevational view of a structure 200 found in a programmable via device fabrication process, in accordance with one or more aspects of the present invention. In the embodiment of FIG. 2A, structure 200 includes a first metal layer 220a which may be disposed above a substrate (not shown), and an insulator layer 212. In one example, insulator layer 212 includes a cavity 211 which may be formed using photolithographic patterning and etching techniques. As described herein, a via link 210 (FIG. 2C) may be disposed within cavity 211.

In one or more embodiments, the substrate, which is not illustrated for clarity, can be a bulk semiconductor material such as a bulk silicon wafer. In another embodiment, substrate 210 can include silicon (Si), single crystal Si, polycrystalline Si, amorphous Si, Si-on-nothing (SON), Si-on-insulator (SOI), or Si-on-replacement insulator (SRI). In a further embodiment, the substrate can be n-type or p-type doped. In such a case, the substrate may be doped, or various regions may be n-type and p-type doped to form various n-wells and p-wells. In one particular example, the substrate can have a thickness of less than or equal to 0.1 micrometers.

FIG. 2B depicts structure 200, after providing a metal portion 213 of a via link (e.g., vial line 210 of FIG. 2C) above a first metal layer, in accordance with one or more aspects of the present invention. In the illustrated embodiment, metal portion 213 is disposed within cavity 211. Any of various deposition processes may be used to dispose metal portion 213 within cavity 211, including, for example, atomic layer deposition or chemical vapor deposition. In one example, metal portion 213 may be deposited over insulator layer 212 and exposed portions of first metal 220a, followed by polishing. For example, metal portion 213 may be a refractory metal such as nickel or titanium, or any other suitable metal. In addition, metal portion 213 may be any metal which is suitable to form a semiconductor-metal alloy.

FIG. 2C depicts structure 200, after providing a semiconductor portion 214 of a via link 210, in accordance with one or more aspects of the present invention. In the illustrated embodiment, semiconductor portion 214 is disposed within cavity 211. For instance, semiconductor portion 214 may be or include an amorphous material, such as amorphous silicon. In addition, semiconductor portion 214 may be or include a polycrystalline material, such as polycrystalline silicon (polysilicon). Semiconductor portion 214 may be heavily doped with either p-type or n-type dopants to increase its conductivity. In one example, after deposition, structure 200 may be planarized or polished to remove any excess material from above insulator layer 212.

FIG. 2D depicts the structure 200, after providing a second metal layer 220b, where via link 210 electrically connects first metal layer 220a and the second metal layer 220b, in accordance with one or more aspects of the present invention. For example, second metal layer 220b may be disposed using any suitable deposition process. In the illustrated embodiment, via link 210 is located in a via between first metal layer 220a and second metal layer 220b.

By way of explanation, during operation of a programmable via device, a pre-determined programming current may flow between first metal layer 220a and second metal layer 220b through via link 210. In such an example, an appropriately tuned current can cause local heating of via link 210, such as Joule heating due to the passage of the current. In one or more embodiments, heating of via link 210 by the programming current may lead to precisely controlled migration of material of metal portion 213 towards semiconductor portion 214, and, for example, formation of a metal semiconductor alloy (e.g., silicidation), or formation of an air gap as material migrates. For example, such material migration and/or silicidation can serve to increase the electrical resistance of the programmable via device, therefore programming the device. In one example, such programming is irreversible, as the migrated atoms after silicidation cannot be returned to their initial locations.

In operation of such a programmable via device, for example, a specific programming current may be used for a specific duration to increase the resistance of the programmable device by a specific amount. In addition, a relatively large programming current and/or a relatively large programming duration may be used to increase the resistance of the programmable device beyond a certain peak value, which can effectively open-circuit the programmable device.

By way of example, such a programmable device can be used to tune an analog integrated circuit to have a specific resistance for use in conjunction with an analog subsystem, such as a radiofrequency transmitter or receiver. In another example, specific values of the resistance may be set and later sensed to store digital information. In one specific example, a starting resistance of via link 210 may be sensed as a digital 1, and a peak resistance value of via link 210 may be sensed as a digital zero. Such "analog programmable device" is possibly formed and operated due to that the mechanism of atom migration and silicidation can be reliably controlled slowly enough by the local temperature from the Joel heating of the programming current.

In one or more embodiments, an array of programmable devices may be fabricated on-chip, along with programming and sensing circuitry, such as sense and set lines, to facilitate programming and reading the programmable devices during run time of the integrated circuit. In another, programmable devices may be precisely programmed a fabrication facility to tune analog circuits such as radiofrequency circuitry to perform within specified tolerances. In one deployment model, programmable devices may be fabricated on-chip, and the chip may be deployed to an assembly factory where the chip and other components are assembled into a finished product, at which time the programmable devices may be programmed in conjunction with other components, such as analog components, to facilitate formation of tuned finished devices incorporating the chip.

In one embodiment, as a programming current flows through via link 210, a reaction may take place between metal portion 213 and semiconductor portion 214 to form a semiconductor-metal alloy (e.g., silicided alloy). For example, semiconductor portion 214 may include silicon and metal portion 213 may include nickel, and the programming current may facilitate formation of nickel silicide. In addition, such reactions may lead to an increase in the electrical resistance of via link 210. For example, this could be due to formation of high resistance nickel silicide or nickel di-silicide phase formation.

In another embodiment, migration of via link portion during programming may lead to a physical gap between metal portion 213 and semiconductor portion 214, leading to a physical open-circuit. As described herein, an open-circuit refers to both a physical separation and a situation in which a peak resistance value is reached that, at the operating voltages used in the integrated circuit, is sensed effectively as an open-circuit.

In one or more embodiments, the shape of via link 210 may be tuned to meet on-chip operating requirements for voltage, programming current, programming time, and the like. For example, metal portion 213 may be formed or deposited with a certain thickness so that sufficient migration of material may take place during a specific interval of a specific programming current. In addition semiconductor portion may have a different height and width to accommodate different circuit requirements. In one example, cavity 211 (FIG. 2A) may have appropriate dimensions or even different, non-rectangular shapes, depending on system requirements.

FIG. 2E depicts structure 200, after programming the programmable via device, in accordance with one or more aspects of the present invention. In the illustrated embodiment, material of metal portion 213 has migrated into surrounding layers, leaving behind an air gap 215. For example, atoms of metal portion 213 may migrate into semiconductor portion 214 during a semiconductor-metal alloy formation process, such as a silicidation process or reaction.

Figure 2F:
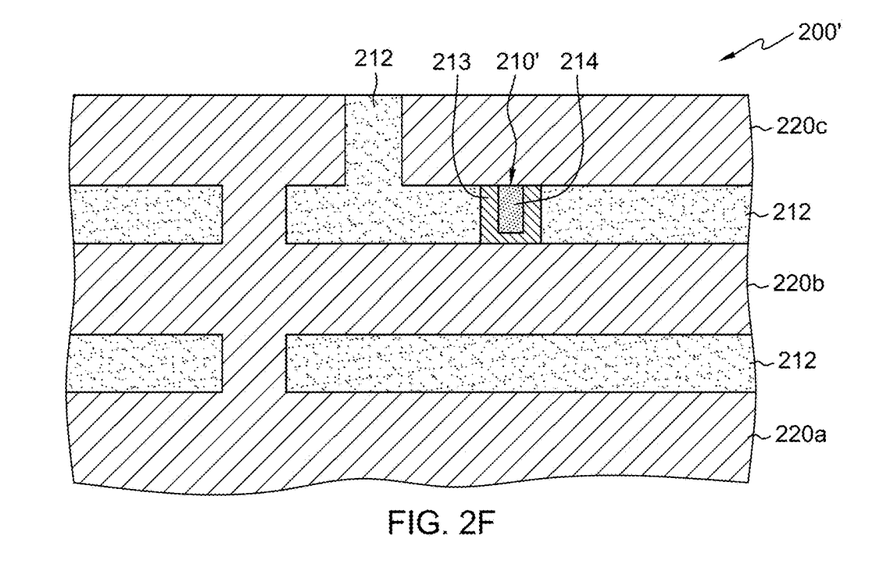
FIG. 2F depicts a structure having a programmable via device, in accordance with one or more aspects of the present invention.

FIG. 2F depicts another structure 200' having a programmable via device, in accordance with one or more aspects of the present invention. In the illustrated embodiment, via link 210' electrically connects second metal layer 220b with a third metal layer 220c. In one or more embodiments, a variety of different shapes and sizes of via link 210, including thickness of metal layer 213 and height and width of semiconductor layer 214 may be used in conjunction with different programming currents of different durations to achieve different resistances. One having ordinary skill in the art will readily understand that test wafers may be prepared with varying materials, shapes, and sizes of via links, metal portion, semiconductor portions, and metal layers, and tested to determine specific programming current levels and durations on an application specific basis.

Figure 3A:
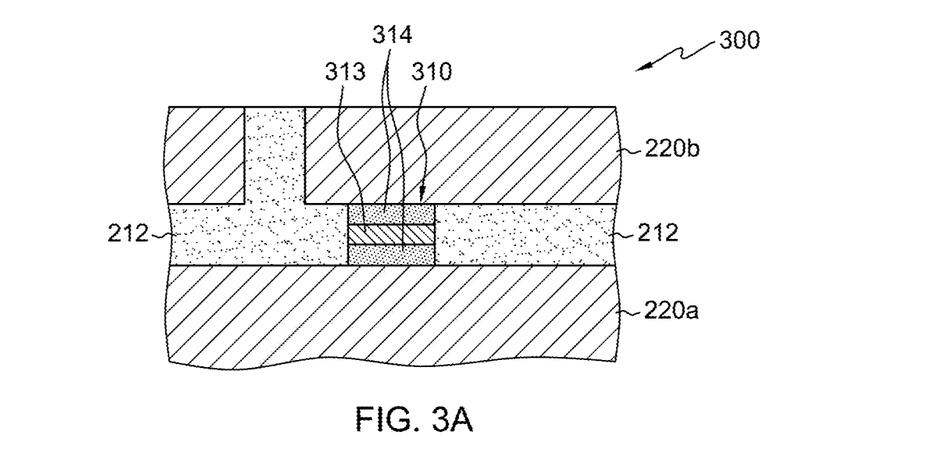
FIG. 3A is a cross sectional elevational view of a structure having a programmable via device, in accordance with one or more aspects of the present invention.

FIG. 3A is a cross sectional elevational view of a structure 300 having a programmable via device with a via link 310, in accordance with one or more aspects of the present invention. In the embodiment of FIG. 3A, via link 310 includes a metal portion 313 sandwiched between a semiconductor portion 314. In one or more embodiments, a via link, such as via link 310, may be formed in a three-layer (or more) deposition process, which may include etching between deposition steps.

Figure 3B:
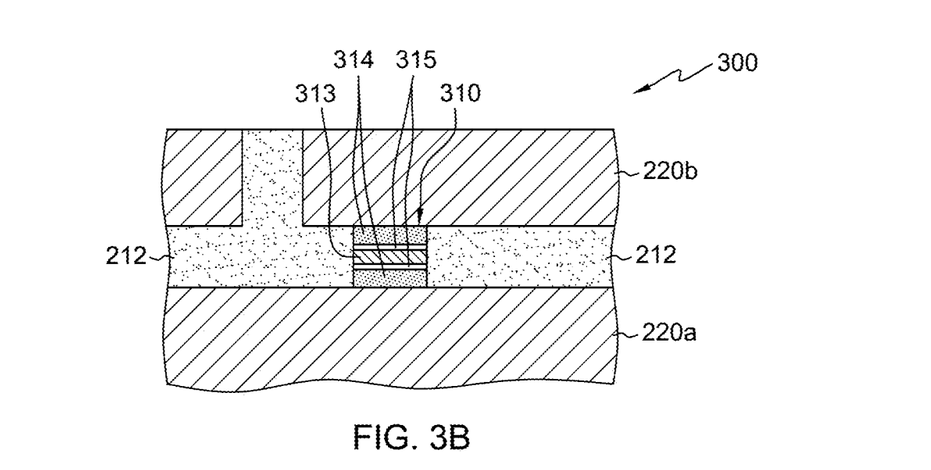
FIG. 3B depicts the structure of FIG. 3A, after programming the programmable via device, in accordance with one or more aspects of the present invention.

FIG. 3B depicts structure 300, after programming the programmable via device, in accordance with one or more aspects of the present invention. In one or more embodiments, portions of metal portion 313 and/or semiconductor portion 314 may migrate into one another to yield one or more air gaps 315.

Figure 4A:
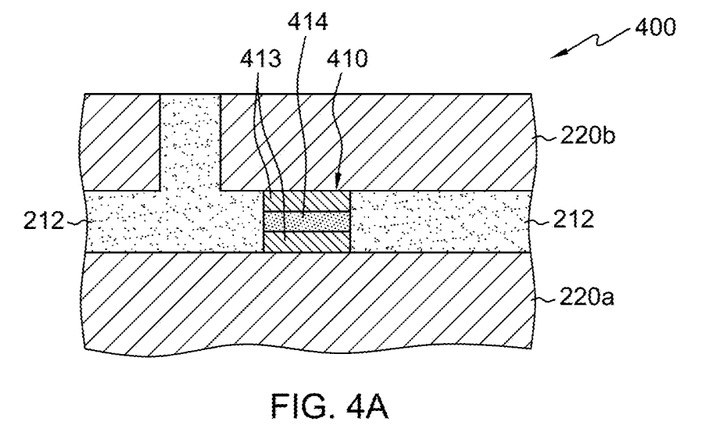
FIG. 4A is a cross sectional elevational view of a structure having a programmable via device, in accordance with one or more aspects of the present invention.

FIG. 4A is a cross sectional elevational view of a structure 400 having a programmable via device with a via link 410, in accordance with one or more aspects of the present invention. In the embodiment of FIG. 4A, via link 410 includes a semiconductor portion 414 sandwiched between a metal portion 414.

Figure 4B:
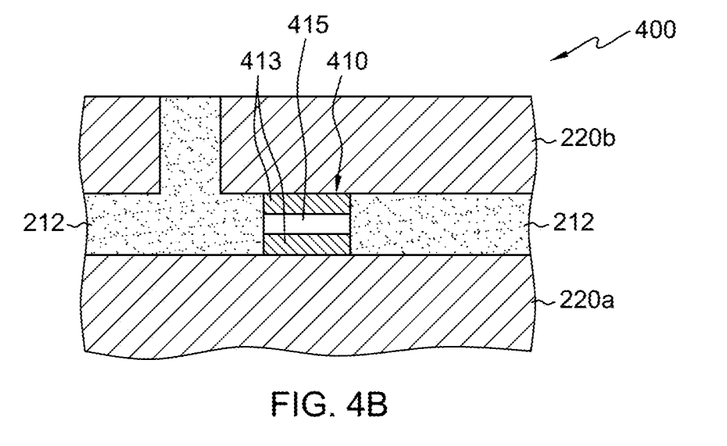
FIG. 4B depicts the structure of FIG. 4A, after programming the programmable via device, in accordance with one or more aspects of the present invention.

FIG. 4B depicts structure 400, after programming the programmable via device, in accordance with one or more aspects of the present invention. In one or more embodiments, portions of semiconductor portion 414 may migrate into surrounding layers, such as metal portion 413 or insulator layer 212 to yield one or more air gaps 415.

Those skilled in the art will note from the above description that there is a need for enhanced programmable devices, such as one-time programmable (OTP) devices, which are compatible with advanced technology nodes, such as sub-20 nanometer nodes, including 14 nanometer or 7 nanometer technologies, and fin-based semiconductor device technologies, which may be formed in the back end of line processes.

In particular, integrated circuits with advanced complementary metal oxide semiconductor devices, non-planar devices (e.g., fin field effect transistors) require a new architecture that provides added enhancements above and beyond so-called e-fuse technologies. Advantageously, the present disclosure provides, in part, technologies for use in low voltage and/or low power programming of programmable devices.

In one or more embodiments, the novel devices described herein may include metal-semiconductor systems, such as metal-Si, metal-Ge, or metal-SiGe, systems, or any other suitable systems that may be used in either front end-of line, middle of line, or back-end of line process flows. For example, the present disclosure is compatible with any stage of integrated circuit fabrication, and includes technologies that allow for on-chip silicidation mechanisms for programming of, for example, enhanced e-fuses or programmable memory devices.

In one implementation, a multiple bit element may be provided, in which each bit of the element corresponds to a different programmable device. For example, by using an appropriate matrix of sensing and programming voltage lines, individual bits may be set. In another implementation, rather than having only a single bit per programmable device, a variable resistance may be achieved by programming with a specified current for a specified duration. In such a manner, each programmable device may store 2, 4, 8, or more bits of information, depending on the achieved resolution of programming and reading the programmable device.

Advantageously, programming of the programmable devices described herein may be achieved through a process involving a metal-semiconductor system in which atoms move due to localized Joule heating, and/or silicide reaction, for instance, during operation of a completed integrated circuit. In addition, on-chip programming can allow for fine-tuning and setting of parameters by systems integrators who assemble finished products involving multiple different integrated circuits or chips because the chips can be tuned during final assembly and test.

As another advantage, the processes described herein, at least in part, allow for low-temperature fabrication. For example, because silicide processing is not necessarily required during fabrication, such processes may be used at any stage of the fabrication process without impacting prior-formed devices which are susceptible to damage from heat.

Further, those having ordinary skill in the art will understand that the low voltage, low power programming provided by these techniques can allow for a greater reliability in the programming and use of the programmable devices. In addition, such techniques may be independent of crystal defects, and may be compatible with scaling.

For instance, described herein are methods and structures of a silicide based via link, which may be integrated into BEOL processes, with via links being disposed in vias between metal layers. In one embodiment, silicide based via links may be formed by depositing polysilicon onto refractory metal filled via, followed by annealing, for example, to form junctions. In such a case, upon passing current through the via link, migration, such as electromigration may occur to create an open circuit at the interface. For example, localized Joule heating may lead to electromigration in a controlled fashion.

In one embodiment, capacitance issues are overcome because such programmable via devices may be formed in upper metal layers in the BEOL, and may not be an active part of the circuit.

Those having skill in the art will note that the programmable via devices disclosed herein have a variety of applications. For instance, such devices may be used for logic, memory, and analog circuits. In addition, the programmable via devices may be implemented in current and future technology nodes through scaling, and may be used with planar, non-planar (e.g., fin-based), or nanowire device technologies. Further, as noted above, the programmable via devices may be formed within any metal layer in the BEOL, affording greater flexibility of placement of the devices. Also, because such programmable via devices include via links which are contained within a via structure, defects may be minimized to any surrounding or collocated devices.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
    a programmable via device, the programmable via device comprising:
        a first metal layer and a second metal layer electrically connected by a via link, the via link comprising:
            a semiconductor portion; and
            at least one metal portion, wherein the at least one metal portion comprises:
                a first metal portion that contacts the first metal layer and separates the semiconductor portion of the via link from the first metal layer; and
                a second metal portion that contacts the second metal layer, and separates the semiconductor portion of the via link from the second metal portion;
            wherein the via link facilitates programming of the programmable via device by applying a programming current through the via link to migrate materials between the semiconductor portion and the at least one metal portion to facilitate a change of an electrical resistance of the via link.

2. The structure of claim 1, wherein the programming current facilitates formation of at least one gap region within the via link, the at least one gap region facilitating the change of the electrical resistance of the via link.

3. The structure of claim 1, wherein
    the semiconductor portion forms a gap region between the first metal portion and the second metal portion.

4. The structure of claim 1, wherein the semiconductor portion of the via link separates the first metal portion and the second metal portion.

5. The structure of claim 1, wherein the programming current is configured to heat the via link to facilitate the migrating of the materials of the via link.

6. The structure of claim 1, wherein the programming current facilitates a reaction of the at least one metal portion and the semiconductor portion of the via link to form a semiconductor-metal alloy.

7. The structure of claim 1, wherein the programming current facilitates increasing an electrical resistance of the via link of the programmable via device.

8. The structure of claim 1, wherein the programming current facilitates open-circuiting the programmable via device.

9. The structure of claim 1, wherein the via link has a certain thickness, the certain thickness of the via link being selected to facilitate programming of the programmable via device with the programming current.

10. A method comprising:
    fabricating a programmable via device, the fabricating comprising:
        forming a first metal layer above a substrate, an insulting layer above the first metal layer, and a second metal layer above the insulating layer;
        providing a via link electrically connecting the first metal layer and the second metal layer, the via link comprising a semiconductor portion and at least one metal portion, wherein the at least one metal portion comprises:
            a first metal portion that separates the first metal layer from the semiconductor portion of the via link; and
            a second metal portion that separates the semiconductor portion of the via link from the second metal layer;
        wherein the via link facilitates programming of the programmable via device by applying a programming current through the via link to migrate materials between the semiconductor portion and the metal portion to facilitate a change of an electrical resistance of the via link.

11. The method of claim 10, wherein the programming current facilitates formation of at least one gap region within the via link, the at least one gap region facilitating the change of the electrical resistance of the via link.

12. The method of claim 10, wherein the semiconductor portion of the via link separates the first metal portion and the second metal portion.

13. The method of claim 10, wherein the programming current is configured to heat the via link to facilitate the migrating of the materials of the via link.

14. The method of claim 10, wherein the programming current facilitates a reaction of the metal portion and the semiconductor portion of the via link to form a semiconductor-metal alloy.

15. The method of claim 10, wherein the programming current facilitates increasing an electrical resistance of the via link of the programmable via device.

16. The method of claim 10, wherein the programming current facilitates open-circuiting the programmable via device.

17. The method of claim 10, wherein the via link has a certain thickness, the certain thickness of the via link being selected to facilitate programming of the programmable via device with the programming current.

* * * * *